(12) United States Patent
Hung et al.

(10) Patent No.: US 10,700,101 B2
(45) Date of Patent: Jun. 30, 2020

(54) DISPLAY PANEL AND DISPLAY DEVICE

(71) Applicant: InnoLux Corporation, Miao-Li County (TW)

(72) Inventors: Meng-Chang Hung, Miao-Li County (TW); Li-Wei Sung, Miao-Li County (TW); Chin-Cheng Chien, Miao-Li County (TW)

(73) Assignee: INNOLUX CORPORATION, Jhu-Nan, Miao-Li County (TW)

( * ) Notice: Subject to any disclaimer, the term of this patent is extended or adjusted under 35 U.S.C. 154(b) by 215 days.

(21) Appl. No.: 15/018,293

(22) Filed: Feb. 8, 2016

(65) Prior Publication Data

US 2016/0260738 A1 Sep. 8, 2016

(30) Foreign Application Priority Data

Mar. 5, 2015 (TW) .............................. 104107061 A

(51) Int. Cl.
*H01L 27/12* (2006.01)
*H01L 27/00* (2006.01)
(Continued)

(52) U.S. Cl.
CPC ........ *H01L 27/124* (2013.01); *G02F 1/13624* (2013.01); *G02F 1/134309* (2013.01); *G02F 1/134363* (2013.01); *H01L 27/1266* (2013.01)

(58) Field of Classification Search
CPC ............... H01L 27/124; H01L 27/1266; G02F 1/13624; G02F 2001/134354
(Continued)

(56) References Cited

U.S. PATENT DOCUMENTS

2007/0195235 A1* 8/2007 Chang ............... G02F 1/133553
349/114
2008/0030833 A1* 2/2008 Park .................. G02F 1/133514
359/259
(Continued)

FOREIGN PATENT DOCUMENTS

CN 1992293 A 7/2007
CN 101183196 A 5/2008
(Continued)

*Primary Examiner* — Kenneth Parker
*Assistant Examiner* — Long H Le
(74) *Attorney, Agent, or Firm* — Muncy, Geissler, Olds & Lowe, P.C.

(57) ABSTRACT

A pixel of the display panel includes a first transistor, a second transistor, a first electrode pattern and a second electrode pattern. A first drain of the first transistor is electrically connected with the first electrode pattern. A second drain of the second transistor is electrically connected with the second electrode pattern. The first electrode pattern comprises a first connection portion and a first protrusion. The second electrode pattern comprises a second connection portion and two second protrusions. The second protrusions are respectively connected with two sides of the second connection portion and are extended towards the first connection portion. The first protrusion is connected with the first connection portion and is extended towards the second connection portion and to the location between the second protrusions. The width of the distal end of each of the first protrusion and the second protrusion is smaller.

24 Claims, 7 Drawing Sheets

(51) Int. Cl.
  *G02F 1/1343* (2006.01)
  *G02F 1/1362* (2006.01)
(58) Field of Classification Search
  USPC .................................................. 349/48, 141
  See application file for complete search history.

(56) References Cited

U.S. PATENT DOCUMENTS

| | | | | |
|---|---|---|---|---|
| 2008/0122800 | A1* | 5/2008 | Meng | G06F 3/0412 |
| | | | | 345/173 |
| 2009/0141010 | A1* | 6/2009 | Liao | G02F 1/13624 |
| | | | | 345/205 |
| 2009/0213285 | A1* | 8/2009 | Yun | G02F 1/133707 |
| | | | | 349/33 |
| 2009/0243971 | A1* | 10/2009 | Uehara | G02F 1/1323 |
| | | | | 345/32 |
| 2012/0013817 | A1* | 1/2012 | Kim | G02F 1/134363 |
| | | | | 349/41 |
| 2012/0236244 | A1* | 9/2012 | Hong | G02F 1/133707 |
| | | | | 349/143 |

FOREIGN PATENT DOCUMENTS

| | | |
|---|---|---|
| CN | 201298129 Y | 8/2009 |
| CN | 103576398 A | 2/2014 |

* cited by examiner

DISPLAY PANEL AND DISPLAY DEVICE

CROSS REFERENCE TO RELATED APPLICATIONS

This Non-provisional application claims priority under 35 U.S.C. § 119(a) on Patent Application No(s). 104107061 filed in Taiwan, Republic of China on Mar. 5, 2015, the entire contents of which are hereby incorporated by reference.

BACKGROUND OF THE INVENTION

Field of Invention

This invention relates to a display panel and a display device and, in particular, to a display panel and a display device having a better display quality.

Related Art

With the progress of technologies, flat display panels have been widely applied to various kinds of fields. Because flat display devices have advantages such as compact structure, low power consumption, less weight and less radiation, gradually take the place of cathode ray tube (CRT) display devices, they are widely applied to various electronic products, such as mobile phones, portable multimedia devices, notebooks, liquid crystal display (LCD) TVs and LCD screens.

Taking a conventional LCD panel as an example, it includes a thin film transistor (TFT) substrate, a color filter (CF) substrate and a liquid crystal layer. The TFT substrate and the CF substrate are disposed oppositely, and the liquid crystal layer is disposed between the two substrates. The TFT substrate includes a plurality of TFTs and a plurality of pixel electrodes which are both disposed on a substrate. The data voltages can be inputted to the corresponding pixel electrodes when the TFTs are controlled and turned on, and then the orientation of the liquid crystal molecules can be controlled by the electric field formed by the voltage difference between the pixel electrode and the common electrode. Thereby, the images can be displayed.

If the display panel is made larger in size, ideally, the pixels at different positions of the display area must have the same common voltage. However, the common voltage at different positions may practically vary due to the problems such as RC loading or process variation, so that the common voltage at the display area will not be uniform. Hence, the optical performance related to the electrical property of the display panel is deteriorated, and the Mura problem occurs thereby. For example, the flicker or cross talk may occur due to the different voltage drops of the LC molecules and become more obvious when the low gray-level image is displayed.

Therefore, a display panel and a display device, whereby the Mura problem caused by the uneven common voltage can be improved and then the display quality can be enhanced, are needed.

SUMMARY OF THE INVENTION

An aspect of the disclosure is to provide a display panel and a display device whereby the Mura problem caused by the uneven common voltage can be improved and then the display quality can be enhanced.

A display panel according to this disclosure comprises a first substrate, a second substrate and at least one pixel. The second substrate is disposed opposite the first substrate. The pixel is configured between the first substrate and the second substrate and comprises a first transistor, a second transistor, a first electrode pattern and a second electrode pattern which are disposed on the first substrate. The first transistor comprises a first drain electrically connected with the first electrode pattern. The second transistor comprises a second drain electrically connected with the second electrode pattern. The first electrode pattern comprises a first connection portion and a first protrusion. The second electrode pattern comprises a second connection portion and two second protrusions. The second protrusions are respectively connected with two sides of the second connection portion and are extended towards the first connection portion. The first protrusion is connected with the first connection portion and the first protrusion is extended towards the second connection portion and the first protrusion is between the second protrusions. The first protrusion comprises a first connection end which is connected with the first connection portion and a first distal end. One of the second protrusions comprises a second connection end which is connected with the second connection portion and a second distal end. A width of the first connection end is greater than that of the first distal end, and a width of the second connection end is greater than that of the second distal end.

A display device according to this disclosure includes a backlight module and a display panel disposed opposite to the backlight module. The display panel comprises a first substrate, a second substrate and at least one pixel. The second substrate is disposed opposite the first substrate. The pixel is configured between the first substrate and the second substrate and comprises a first transistor, a second transistor, a first electrode pattern and a second electrode pattern which are disposed on the first substrate. The first transistor comprises a first drain electrically connected with the first electrode pattern. The second transistor comprises a second drain electrically connected with the second electrode pattern. The first electrode pattern comprises a first connection portion and a first protrusion. The second electrode pattern comprises a second connection portion and two second protrusions. The second protrusions are respectively connected with two sides of the second connection portion and are extended towards the first connection portion. The first protrusion is connected with the first connection portion, and the first protrusion is extended towards the second connection portion and the first protrusion is between the second protrusions. The first protrusion comprises a first connection end which is connected with the first connection portion and a first distal end. One of the second protrusions comprises a second connection end which is connected with the second connection portion and a second distal end. A width of the first connection end is greater than that of the first distal end, and a width of the second connection end is greater than that of the second distal end.

In one embodiment, an interval between the first protrusion and one of the second protrusions is between 8 μm and 30 μm.

In one embodiment, the first transistor and the second transistor are disposed symmetrically.

In one embodiment, the first drain is electrically connected with the first electrode pattern through a first via, and the second drain is electrically connected with the second electrode pattern through two second vias.

In one embodiment, the second vias are disposed corresponding to the second protrusions.

In one embodiment, the pixel further comprises a scan line, a first data line and a second data line, the first transistor further comprises a first gate and a first source, the second transistor further comprises a second gate and a second source, the scan line is connected with the first gate and the second gate, the first data line is connected with the first source, and the second data line is connected with the second source.

In one embodiment, the pixel further comprises a third electrode pattern, which is disposed around the first electrode pattern and the second electrode pattern.

In one embodiment, the pixel further comprises a third electrode pattern and a first data line, the first data line is disposed beside the pixel, the third electrode pattern is disposed at the periphery of the pixel, and the third electrode pattern partially overlaps the first electrode pattern and the first data line.

In one embodiment, the first connection portion of the first electrode pattern comprises a first opening, the third electrode pattern comprises a second opening, the first opening overlaps the third electrode pattern, and the second opening is adjacent to the first opening and partially overlaps the first connection portion.

In one embodiment, the display panel comprises a plurality of pixels. Each of the pixels comprises two data lines respectively disposed at two sides of the pixel, and for the adjacent two pixels, voltage signals of the two data lines closer to each other have the same polarity.

In one embodiment, an opening area on two sides of the extending direction of the first protrusion of the pixel has a symmetrical shape.

As mentioned above, in the display panel and the display device of the disclosure, the first electrode pattern of the pixel includes a first connection portion and a first protrusion and the second electrode pattern of the pixel includes a second connection portion and two second protrusions. The second protrusions are respectively connected with two sides of the second connection portion and are extended towards the first connection portion. The first protrusion is connected with the first connection portion and is extended towards the second connection portion and to the location between the second protrusions. The first protrusion includes a first connection end which is connected with the first connection portion and a first distal end, and one of the second protrusions includes a second connection end which is connected with the second connection portion and a second distal end. Besides, the width of the first connection end is greater than that of the first distal end, and the width of the second connection end is greater than that of the second distal end. By the pixel layout design of this disclosure, when the first data voltage is transmitted to the first electrode pattern through the first data line and the second data voltage is transmitted to the second electrode pattern through the second data line, a voltage difference is formed between the first electrode pattern and the second electrode pattern to form the electric field driving the LC molecules of the pixel, so that the pixel can correspondingly display and the display panel can display an image. Accordingly, in comparison with the conventional art, because the voltage drop for driving the LC molecules is not formed by the pixel electrode and the common electrode, the Mura problem won't be caused even if the common voltage at the display area is not uniform. Therefore, the display quality of the display panel and the display device can be improved.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
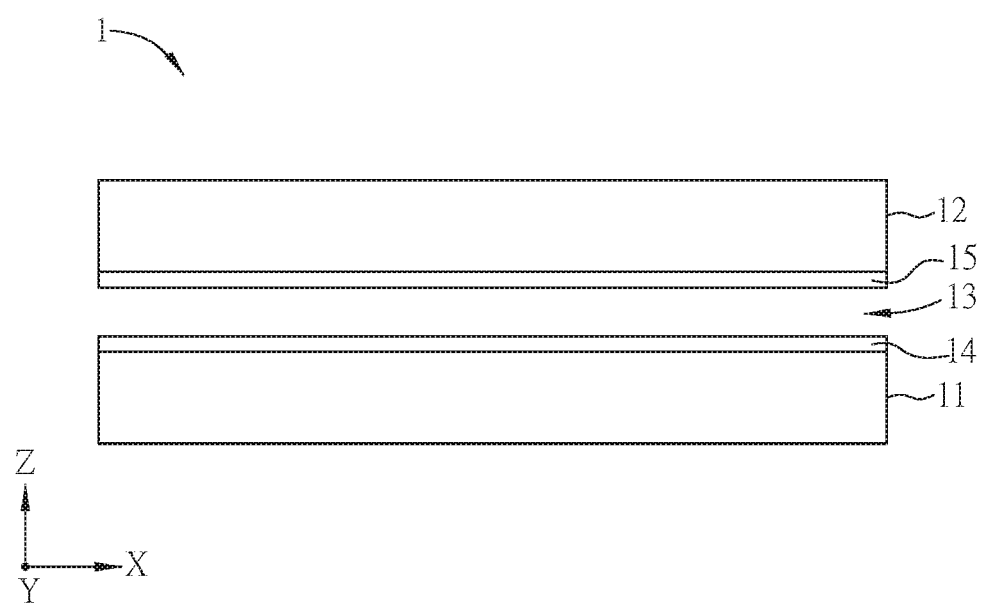
FIG. 1 is a schematic diagram of the display panel of an embodiment of the disclosure.
Figure 2A:
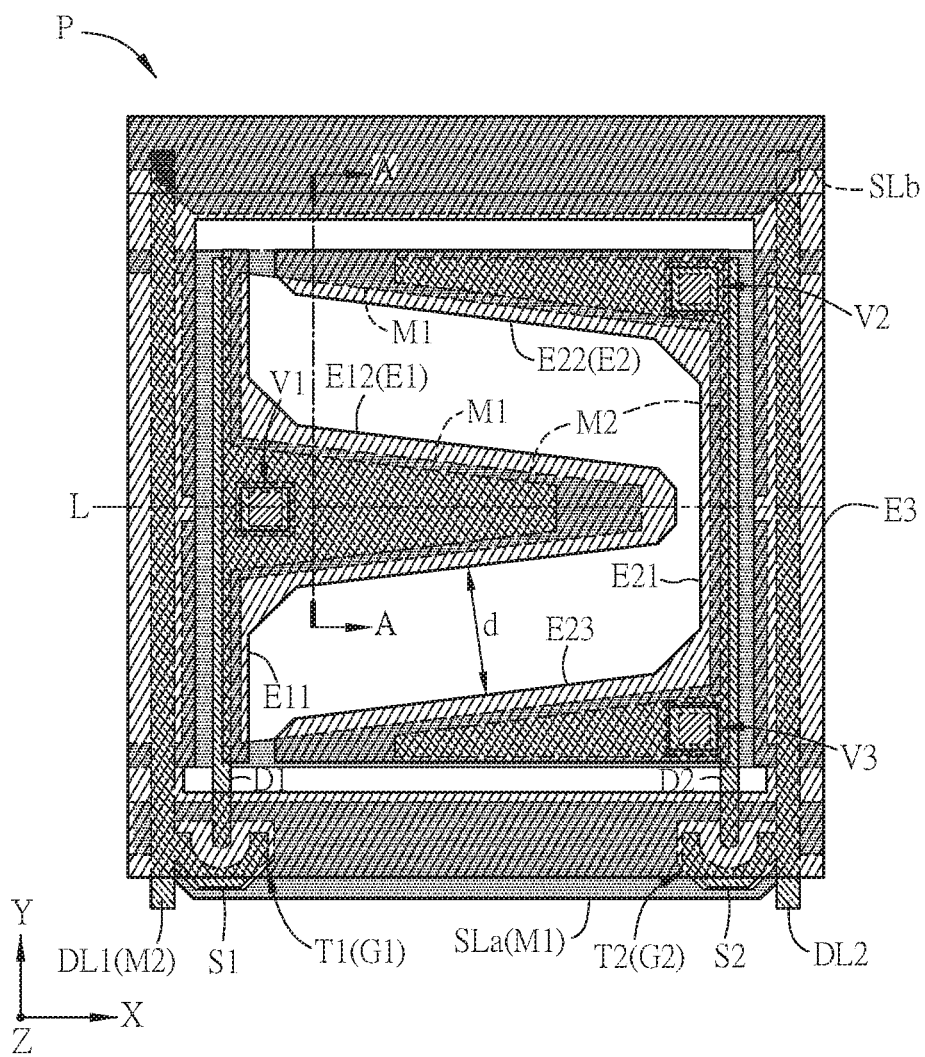
FIG. 2A is a schematic diagram of the layout of a pixel of the display panel of FIG. 1.
Figure 2B:
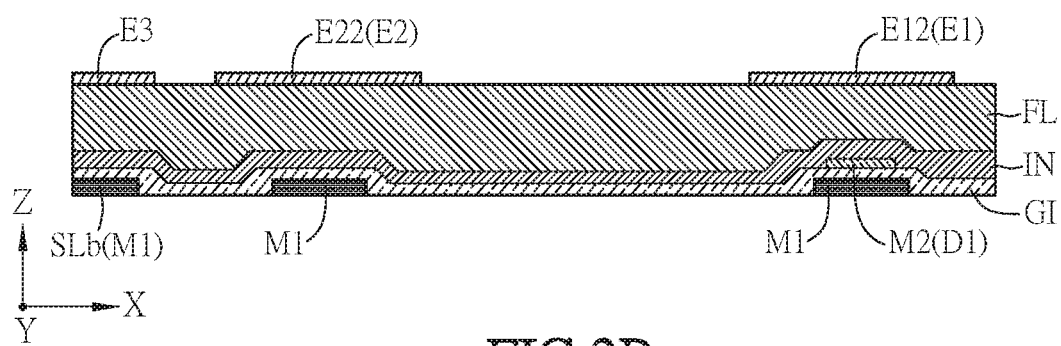
FIG. 2B is a schematic sectional diagram taken along the line A-A of FIG. 2A.

Refer to FIGS. 1, 2A and 2B, wherein FIG. 1 is a schematic diagram of the display panel 1 of an embodiment of the disclosure, FIG. 2A is a schematic diagram of the layout of a pixel P of the display panel 1 of FIG. 1, and FIG. 2B is a schematic sectional diagram taken along the line A-A of FIG. 2A.

The display panel 1 of this embodiment is, for example but not limited to, a fringe field switching (FFS) LCD panel, an In-plane switching (IPS) LCD panel, a twisted nematic (TN) LCD panel or a vertical alignment (VA) LCD panel. For facilitating the understanding of the figures, a first direction X, a second direction Y and a third direction Z are shown in the figures, and any two of them are perpendicular to each other. The first direction X may be substantially parallel to the extending direction of the scan line of the display panel 1, the second direction Y may be substantially parallel to the extending direction of the data line of the display panel 1, and the third direction Z is perpendicular to the first direction X and the second direction Y.

As shown in FIG. 1, the display panel 1 includes a first substrate 11 and a second substrate 12, and the first substrate 11 and the second substrate 12 are disposed oppositely. The first substrate 11 or the second substrate 12 may be made of transparent material, such as glass, quartz or the like, plastic material, rubber, fiberglass or other polymer materials. Or, the first substrate 11 or the second substrate 12 may be made of opaque material, and may be a metal-fiberglass composite plate, a metal-ceramic composite plate, a printed circuit board or others for example. In this embodiment, the first substrate 11 and the second substrate 12 are both made of transparent glass material for example. Moreover, the display panel 1 further includes a liquid crystal layer 13, a thin film transistor (TFT) array 14 and a color filter (CF) array 15. The TFT array 14 is disposed on the side of the first substrate 11 facing the second substrate 12, and the CF array 15 can be disposed on the side of the second substrate 12 facing the first substrate 11 or on the side of the first substrate 11 facing the second substrate 12. Herein, the CF array 15 is disposed on the side of the second substrate 12 facing the first substrate 11. However, when the CF array 15 is disposed on the first substrate 11, the first substrate 11 becomes a COA (color filter on array) substrate. Moreover, the liquid crystal layer 13 is disposed between the first substrate 11 and the second substrate 12 and between the TFT array 14 and the CF array 15. The TFT array 14, the CF array 15 and the liquid crystal layer 13 form a pixel array including at least one pixel (or called a sub-pixel) P. Herein for example, a plurality of pixels P are arranged like a matrix.

As shown in FIGS. 2A and 2B, the pixel P includes a first transistor T1, a second transistor T2, a first electrode pattern E1 and a second electrode pattern E2. The first transistor T1, the second transistor T2, the first electrode pattern E1 and the second electrode pattern E2 are disposed on the first substrate 11. Moreover, the pixel P of this embodiment further includes a scan line SLa, a first data line DL1 and a second data line DL2. The first data line DL1 and the second data line DL2 are respectively disposed at two sides of the pixel P, and each of the first data line DL1 and the second data line DL2 is disposed across the scan line SLa and the scan line SLb of the adjacent pixel (not shown). In this embodiment, the first transistor T1 and the second transistor T2 are both a thin film transistor (TFT), and they are disposed symmetrically in the pixel P. By the symmetric disposition of the first transistor T1 and the second transistor T2, the storage capacitances (formed by the overlay area of the metal layers) of the first transistor T1 and the second transistor T2 are as possible as the same in magnitude, and therefore the feedthrough voltages of the first transistor T1 and the second transistor T2 of the pixel P are also as possible as the same if the process variation exists.

The first transistor T1 includes a first gate G1, a first source S1 and a first drain D1, and the second transistor T2 includes a second gate G2, a second source S2 and a second drain D2. Each of the first gate G1 and the second gate G2 may be a single-layer or multi-layer structure formed by metal (e.g. aluminum, copper, silver, molybdenum, or titanium) or alloy. The first gate G1 and the second gate G2 of this embodiment are formed in the same layer (the so-called first metal layer M1) by the same process step as the scan line SLa, and they are connected with each other. The first source S1 and the first drain D1 of the first transistor T1 are disposed on a first active layer (not shown) and contact the first active layer. When the first active layer of the first transistor T1 is not conductive, the first source S1 and the first drain D1 are electrically isolated from each other. Moreover, the second source S2 and the second drain D2 of the second transistor T2 are disposed on a second active layer (not shown) and contact the second active layer. When the second active layer of the second transistor T2 is not conductive, the second source S2 and the second drain D2 are electrically isolated from each other. Each of the first source S1, the first drain D1, the second source S2 and the second drain D2 may be a single-layer or multi-layer structure formed by metal (e.g. aluminum, copper, silver, molybdenum, or titanium) or alloy. Herein, the first source S1, the first drain D1, the second source S2 and the second drain D2 are formed in the same layer (the so-called second metal layer M2) by the same process step as the first data line DL1 and the second data line DL2. Besides, the first data line DL1 is connected with the first source S1, and the data line DL2 is connected with the second source S2.

The first drain D1 is electrically connected with the first electrode pattern E1, and the second drain D2 is electrically connected with the second electrode pattern E2. The first electrode pattern E1 and the second electrode pattern E2 may be transparent electrode layers, and the material thereof may be ITO (indium tin oxide), IZO (indium zinc oxide), AZO (Al-doped zinc oxide), cadmium tin oxide (CTO), $SnO_2$, ZnO or other transparent conducting materials. The first electrode pattern E1 includes a first connection portion E11 and a first protrusion E12. The second electrode pattern E2 includes a second connection portion E21 and two second protrusions E22, E23. The second protrusions E22, E23 are respectively connected with two sides of the second connection portion E21 and are extended towards the first connection portion E11. The first protrusion E12 is connected with the first connection portion E11 and is extended towards the second connection portion E21 to a location between the second protrusions E22, E23. Herein, the second protrusions E22, E23 are respectively disposed at two sides of the second connection portion E21 and are extended towards the first connection portion E11, and the first protrusion E12 is connected with the central part of the first connection portion E11 and extended towards the second connection portion E21 to a location between the second protrusions E22, E23. Moreover, the first protrusion E12 includes a first connection end which is connected with the first connection portion E11 and a first distal end (not marked for the conciseness of the figure), and one of the second protrusions E22, E23 includes a second connection end, which is connected with the second connection portion E21, and a second distal end (not marked for the conciseness of the figure). The width of the first connection end is greater than that of the first distal end, and the width of the second connection end is greater than that of the second distal end. In other words, as shown in FIG. 2A, the joint of the first protrusion E12 and the first connection portion E11 of this embodiment is wider, and the distal end of the first protrusion portion E12 is thinner relative to the joint. Besides, the joints of the two second protrusions E22, E23 and the second connection portion E21 are also wider, and the distal ends of the second protrusions E22, E23 are also thinner relative to the joints.

In this embodiment, the first drain D1 is electrically connected with the first electrode pattern E1 through a first via V1, and the second drain D2 is electrically connected with the second electrode pattern E2 through two second vias V2, V3. Herein, the first via V1 is disposed adjacent to the joint of the first protrusion E12 and the first connection portion E11 The two second vias V2, V3 are respectively disposed at two sides of the second connection portion E21, and they are adjacent to the joints of the second protrusions E22, E23 and the second connection portion E21. The two second vias V2, V3 are respectively disposed at the two sides of the second connection portion E21, so as to avoid the dark fringes which correspondingly occurs resulting from that the second connection portion E21 is broken into two parts. When the second connection portion E21 is broken into two parts, the second drain D2 can be electrically connected with the two parts of the second connection portion E21 through the second vias V2, V3, respectively, so the corresponding dark fringe is avoided.

The interval d between the first protrusion E12 and one of the second protrusions E22, E23 is between 8 μm and 30 μm. Herein, as shown in FIG. 2A, the first protrusion E12 is disposed at the middle of the second protrusions E22, E23, so that the interval d between the first protrusion E12 and the second protrusion E22 and the interval d between the first protrusion E12 and the second protrusion E23 are both between 8 μm and 30 μm (8 μm≤d≤30 μm). In comparison with the conventional art where the pixel electrode of the pixel is usually designed as including many protrusions (or called branch electrodes), in this embodiment, fewer protrusions (just three protrusions) are used so that the interval d between the protrusions (between the first protrusion E12 and the second protrusion E22 and between the first protrusion E12 and the second protrusion E23) can be enlarged (only 8 μm~16 μm in the conventional art). Therefore, if the wire width or interval of the electrode is subjected to the variation (the so-called critical dimension, CD) in the process of this embodiment, the resulted Pin Mura problem can be reduced. Moreover, because the device in this embodiment includes fewer protrusions, the quantity of the correspondingly generated dark fringe (the dark fringe are generated at the corresponding electrode when the light passes through the corresponding pixel P) also can be reduced and the transmittance can be enhanced. Furthermore, in comparison with the conventional art, the quantity of the turning portion of the electrode of the pixel P of this embodiment can be reduced (the turning portion is usually the discontinuous area of the LC molecules). Therefore, the LC molecules have fewer discontinuous areas, so that the LC performance is enhanced and the contrast and the transmittance is increased.

In this embodiment, the opening area has symmetrical shapes at the two sides of the extending direction of the first protrusion E12 of the pixel P. Herein, the opening area is the area between the first electrode pattern E1 and the second electrode pattern E2 where the electrode is not disposed (the hollow area). In other words, in the pixel P of this embodiment, an imaginary line L is substantially parallel to the first direction X and passes through the center of the first protrusion E12, the upper portion and the lower portion of the first protrusion E12 have symmetric patterns, and the opening area has symmetric shapes at the two sides of the imaginary line L.

The pixel P of this embodiment further includes a third electrode pattern E3. The third electrode pattern E3 is disposed around the first electrode pattern E1 and the second electrode pattern E2. The third electrode pattern E3 may be formed by the same process step and made of the same material as the first electrode pattern E1 and the second electrode pattern E2 (in the same layer). The control circuit driving the display panel 1 can provide a common voltage (Vcom) for the third electrode pattern E3, but the LC molecules in this embodiment are not driven by the voltage difference between the common voltage and the first electrode pattern E1 or between the common voltage and the second electrode pattern E2, which will be illustrated as below.

As shown in FIG. 2B, the pixel P further includes a gate dielectric layer GI, an insulating layer IN and a planarization layer FL (which are not shown in the layout of FIG. 2A for the conciseness of FIG. 2A). The gate dielectric layer GI is disposed on and covers the first metal layer M1 (the scan line SLa, the first gate G1, the second gate G2), and the second metal layer M2 (the first data line DL1, the second data line DL2, the first drain D1, the second drain D2, . . . ) is disposed on the gate dielectric layer GI. Moreover, the insulating layer IN is disposed on the second metal layer M2, and the planarization layer FL is disposed on the insulating layer IN. The gate dielectric layer GI, the insulating layer IN and the planarization layer FL may be made of photoresist material, resin material or inorganic material (e.g. SiOx/SiNx). By the disposition of the gate dielectric layer GI, the insulating layer IN and the planarization layer FL, the electrical connection among the first metal layer M1, the second metal layer M2 and the first electrode pattern E1 (or the second electrode pattern E2 or the third electrode pattern E3) can be avoided.

Figure 3:
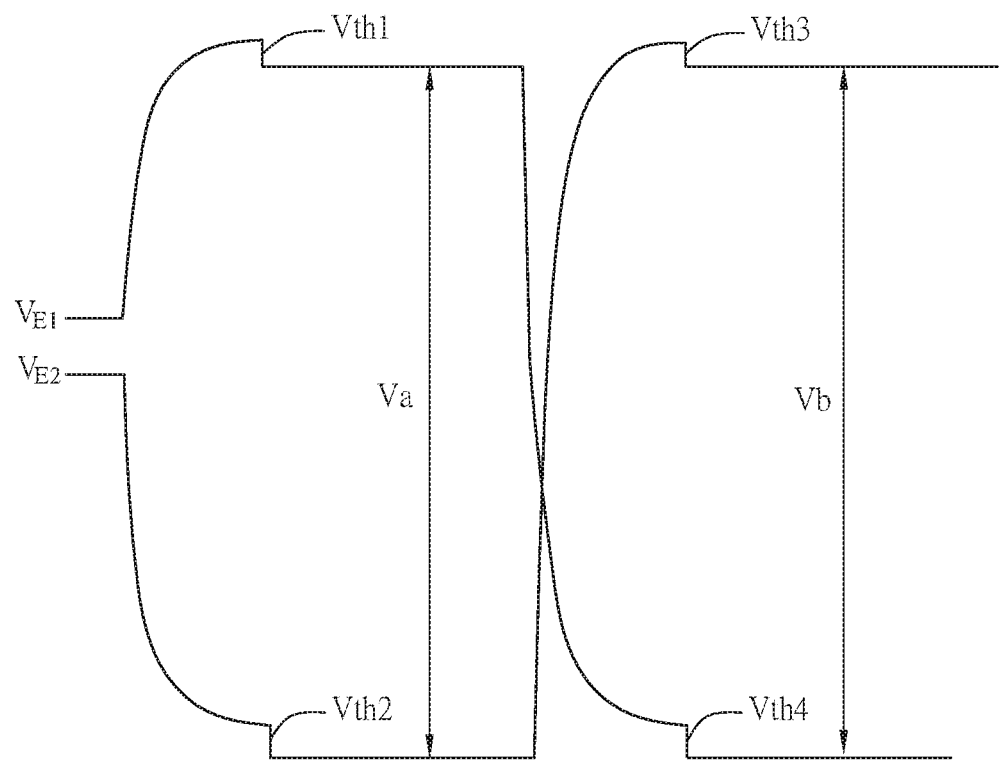
FIG. 3 is a schematic diagram of the driving waveforms of the pixel of FIG. 2A.

Accordingly, as shown in FIG. 3, when a scan signal is sequentially received by the scan lines SLa of the pixels P of the display panel 1, it turns on the corresponding first transistor T1 and second transistor T2. Thus, a first data voltage VE1 for the pixel P is transmitted to the first electrode pattern E1 through the first data line DL1 and a second data voltage VE2 for the same pixel P is transmitted to the second electrode pattern E2 through the second data line DL2. Therefore, a voltage difference is formed between the first electrode pattern E1 and the second electrode pattern E2 to generate the electric field to drive the LC molecules in the corresponding pixel P, so that the pixel P can correspondingly display and the display panel 1 can display an image. Because the first transistor T1 and the second transistor T2 of the pixel P are arranged symmetrically, the sum of the voltage drops (Vth1+Vth2) caused by the feedthrough effect in the positive half cycle and the negative half cycle with the first data voltage VE1 is equal to the sum of the voltage drops (Vth3+Vth4) caused by the feedthrough effect in the negative half cycle and the positive half cycle with the second data voltage VE2. Therefore, the voltage difference Va in the positive half cycle between the first electrode pattern E1 and the second electrode pattern E2 is equal to the voltage difference Vb in the negative half cycle between the first electrode pattern E1 and the second electrode pattern E2, so that the uniform feedthrough voltage is obtained and the pixel P does not undergo the Mura problem. Besides, because the voltage drop for driving the LC molecules is not formed by the pixel electrode and the common electrode (the voltage drop for driving the LC molecules is formed by the pixel electrode and the common electrode in the conventional art) for all pixels P of the display panel 1 of this embodiment, in comparison with the conventional art, the Mura problem won't occur in the display panel 1 even if the common voltage at the display area is not uniform. Therefore, the display quality can be improved.

Figure 4:
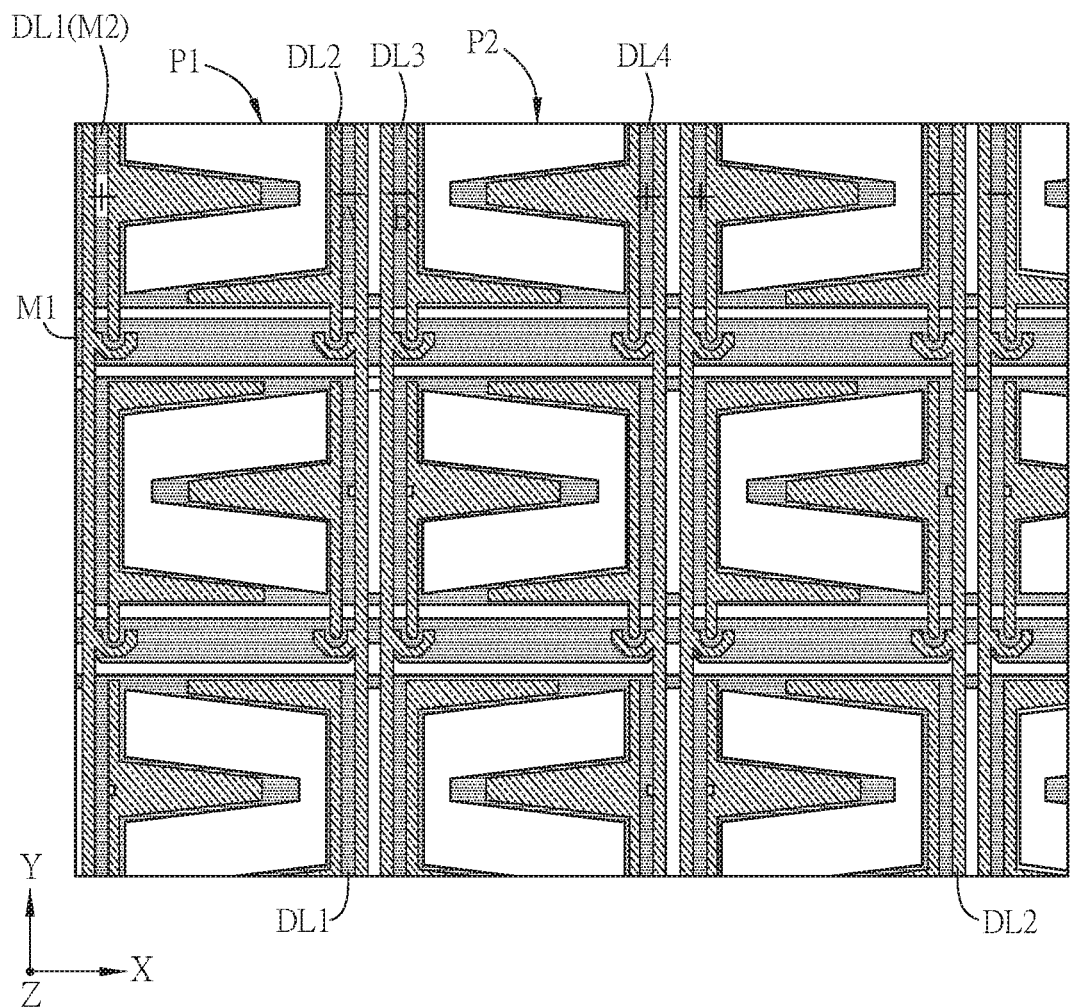
FIG. 4 is a schematic diagram of the pixel array of an embodiment of the disclosure.

Refer to FIG. 4, which is a schematic diagram of the pixel array of an embodiment of the disclosure. Herein, the two adjacent pixels P1, P2 are marked, but the layout of the pixels P1, P2 is not completely shown. The complete layout thereof can refer to FIG. 2A.

For the LCD panel, the LC molecules can't be fixed at a certain voltage for a long time, or they can't be rotated anymore to form different gray levels according to the variation of the electric field due to the damage to the LC property even if the voltage is removed. Therefore, the voltage needs to be restored at intervals to avoid the LC characteristic from being destroyed. As to the driving technology, the column inversion (saving more power) driving method can be used, so that the panel can obtain the equivalent dot inversion result and thus obtain a better display quality.

In the pixels of FIG. 4, two pixels vertically adjacent to each other and two pixels horizontally adjacent to each other both are arranged by flip pixel arrangement. However, when the pixels are driven by the conventional technology such as the "1+2" row inversion driving method, some parts in the pixel are too bright. Therefore, in this embodiment, the "1+2" column inversion driving method (the first data line has positive polarity, the second and third data lines have negative polarity, the fourth and fifth data lines have positive polarity, etc.) is used to provide the dot inversion for the panel. Each of the pixels has two data lines respectively disposed at the two sides of the pixel (for example, in FIG. 4, the first data line DL1 and the second data line DL2 are respectively disposed at the two sides of the pixel P1, and the third data line DL3 and the forth data line DL4 are respectively disposed at the two sides of the pixel P2), and for the adjacent two pixels, the voltage signals of the two data lines closer to each other have the same polarity. That is, for the data signals driving the adjacent two pixels P1, P2, the voltage signals inputted to the second data line DL2 and the third data line DL3 both have negative polarity (or positive polarity), and the problem that some parts of the pixel array are too bright can be improved. The reason for the above mention is illustrated as below. For example, the second metal layer M2 is shifted to the right side due to manufacturing process variation, the second data line DL2 at the location A is also shifted rightward off the underneath first metal layer M1, so that the coupling between the data signal applied to the second data line DL2 and the first metal layer M1 is reduced. However, because the third data line DL3 at the location B is also shifted rightward, the coupling between the data signal applied to the third data line DL3 and the first metal layer M1 is increased. Because the data signals at the locations A and B have the same polarity, as a whole, the total coupling amount of the same polarity does not change. Therefore, the problem that some parts in the pixel are too bright will as little as possibly occur (i.e. more uniformity can be provided).

To be noted, the above mention refers to that the "1+2" column inversion driving method is used to provide the dot inversion for the panel. However, this disclosure is not limited thereto. In other embodiments, other driving methods, such as the column inversion or the "1+2" row inversion, can be used to drive the pixels, and it is more flexible to apply appropriate driving methods.

Figure 5A:
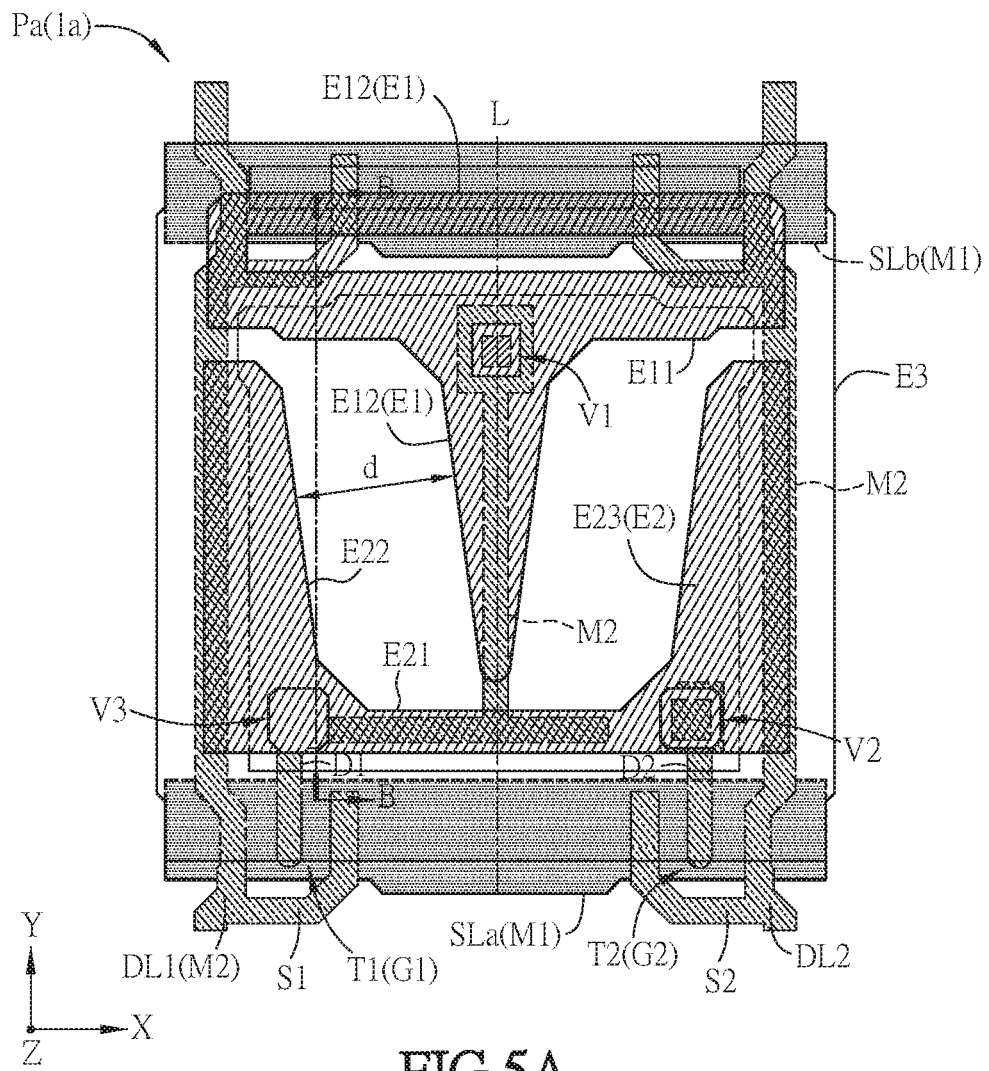
FIG. 5A is a schematic diagram of the layout of the pixel of the display panel of another embodiment of the disclosure.
Figure 5B:
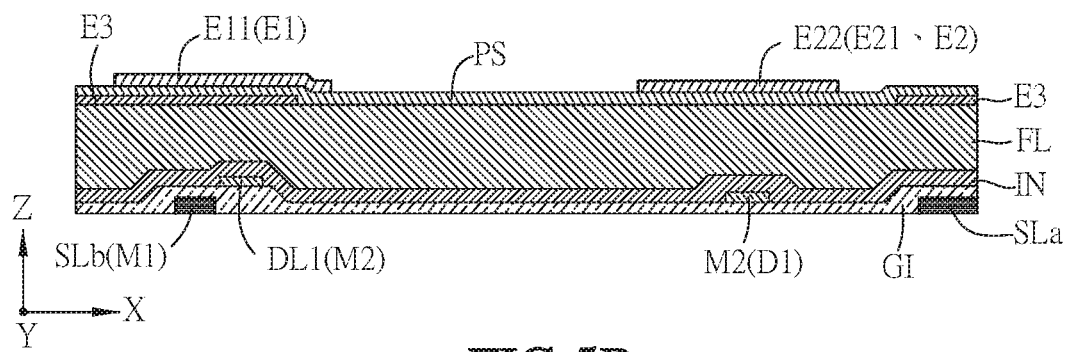
FIG. 5B is a schematic sectional diagram taken along the line B-B in FIG. 5A.

Moreover, refer to FIG. 5A, which is a schematic diagram of the layout of the pixel Pa of the display panel 1a of another embodiment of the disclosure. FIG. 5B is a schematic sectional diagram taken along the line B-B in FIG. 5A.

As shown in FIGS. 5A and 5B, the main difference between the pixel Pa and the pixel P in FIG. 2A is that the two second protrusions E22, E23 of the second electrode pattern E2 of the pixel Pa are extended upwards and towards the first connection portion E11, and the first protrusion E12 of the first electrode pattern E1 is extended downwards and extended towards the second connection portion E21 to the location between the second protrusions E22, E23.

The third electrode pattern E3 of the pixel Pa is disposed at the periphery of the pixel Pa (the third electrode pattern E3 has a hollow shape). Besides, a part of the third electrode pattern E3 is disposed between the first electrode pattern E1 and the first data line DL1, so that the third electrode pattern E3 partially overlaps the first electrode pattern E1 and the first data line DL1 along the third direction Z. Herein, the third electrode pattern E1 can be partially disposed between the first electrode pattern E1 and the first data line DL1 and between the second electrode pattern E2 and the second data line DL2. A passivation layer PS is disposed to separate the third electrode pattern E3 from the first electrode pattern E1 and the second electrode pattern E2. The function of the third electrode pattern E3 is to shield the electric field formed by the underneath data lines (or the scan lines), so that the signals of the data lines or the scan lines won't affect the voltage drop between the first electrode pattern E1 and the second electrode pattern E2. Besides, the third electrode pattern E3 can function as the storage capacitance of the pixel. Moreover, in this embodiment, the first electrode pattern E1 partially overlaps the first data line DL1 and the second electrode pattern E2 partially overlaps the second data line DL2, so as to increase the aperture ratio of the pixel Pa (suitable for the high PPI (pixels per inch) case).

Moreover, the opening area also has symmetrical shapes at the two sides of the extending direction of the first protrusion E12 of the pixel Pa. In other words, in the pixel Pa of this embodiment, an imaginary line L is substantially parallel to the second direction Y and passes through the center of the first protrusion E12. The left portion and the right portion of the first protrusion E12 have symmetrical patterns, and the opening area has symmetrical shapes at the two sides of the imaginary line L.

Other technical features of the pixel Pa of the display panel 1a can refer to the components of the pixel P of the display panel 1, so the related illustrations are omitted here for conciseness.

Figure 5C:
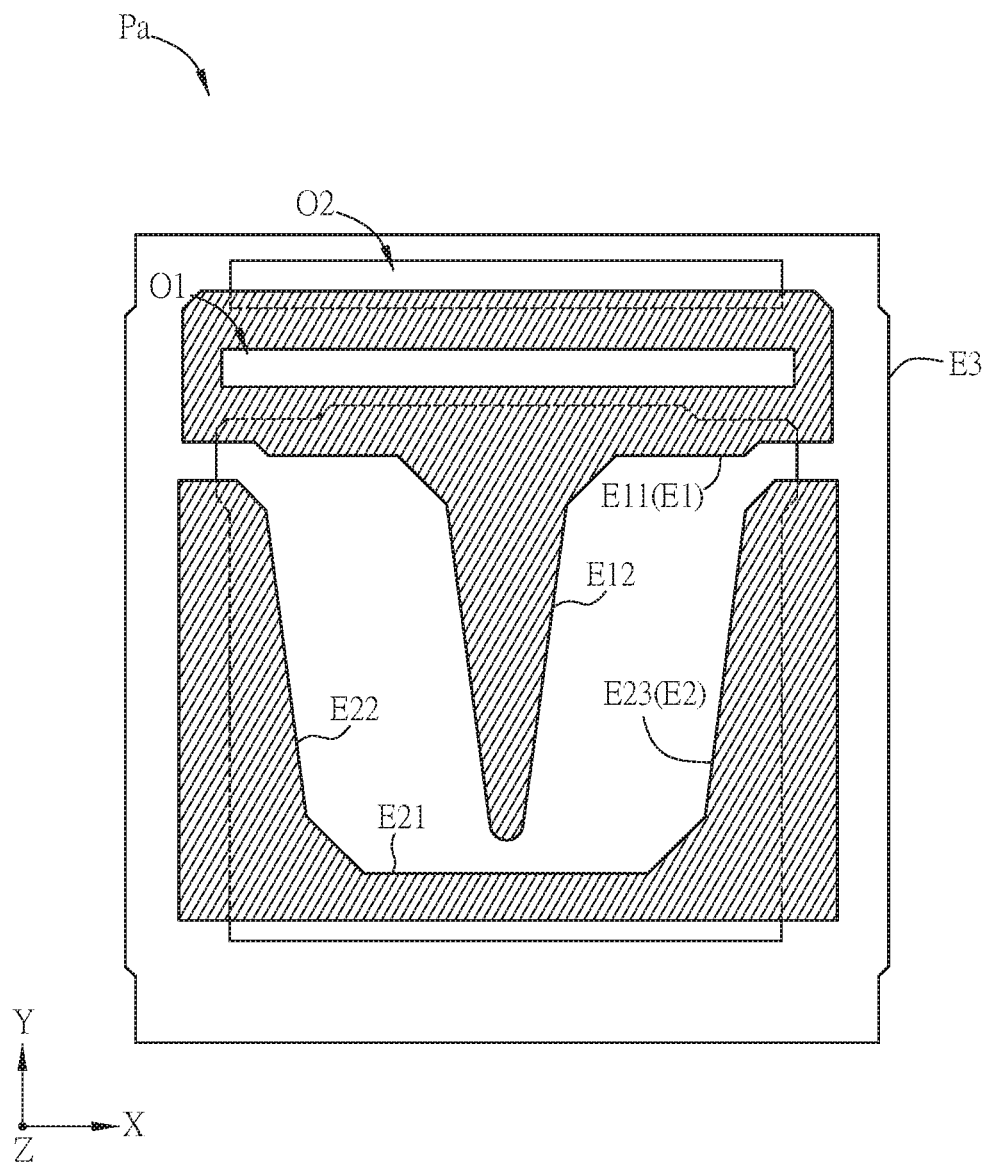
FIG. 5C is another schematic diagram of the pixel of FIG. 5A.

Referring to FIG. 5C, it is another schematic diagram of the pixel Pa of FIG. 5A. For clearly illustrating the features, FIG. 5C just shows the layouts of the first electrode pattern E1, the second electrode pattern E2 and the third electrode pattern E3.

In the LCD panel, it needs to improve inferior electrical property deteriorated by the feedthrough in the pixels for better display quality. The feedthrough voltage of the pixel can be positively proportional to the ratio of $Cgs/(Cst+Clc+Cgs)$, wherein Cst is the value of the storage capacitance, Clc is the value of the LC capacitance and Cgs is the value of the capacitance formed by the gate and the source of the thin film transistor. When the pixel layout is completed, the overlap area of the metal layers is fixed, so the value of the capacitance is also determined and the ratio of $Cgs/(Cst+Clc+Cgs)$ is also fixed. Moreover, the ratio of $Cgs/(Cst+Clc+Cgs)$ is also varied due to manufacturing process variation. To reduce the variation of the feedthrough, the variation of the ratio of $Cgs/(Cst+Clc+Cgs)$ should need to be reduced relatively. Furthermore, to reduce the variation of the ratio of $Cgs/(Cst+Clc+Cgs)$, the variation of the overlap area of the metal layers should be reduced. Therefore, by reducing the variation of the overlap area of the metal layers, the variation of the feedthrough voltage caused by the process variation can be reduced.

In this embodiment, the electrode pattern is hollowed to increase the electrode circumference and reduce the electrode area to reduce the variation of the ratio of $Cgs/(Cst+Clc+Cgs)$ caused by the process variation, so as to reduce the variation of the feedthrough voltage caused by the feedthrough. As shown in FIG. 5C, in this embodiment, the first connection portion E11 of the first electrode pattern E1 includes a first opening O1, the third electrode pattern E3 includes a second opening O2 (the openings O1, O2 are both rectangular ones), the first opening O1 overlaps the third electrode pattern E3, and the second opening O2 is adjacent to the first opening O1 and partially overlaps the first connection portion E11. When the manufacturing process variation occurs, the first opening O1 of the first electrode pattern E1 can compensate the variation of the feedthrough voltage which results from the variation of the wire width or the wire interval (critical dimension, CD) of the first electrode pattern E1 or the third electrode pattern E3 in the manufacturing process. Therefore the variation of the feedthrough voltage can be reduced. Besides, the second opening O2 of the third electrode pattern E3 can compensate the variation of the feedthrough voltage caused by the variation of the overlap area (i.e. the variation of Cst and Cgs) of the first electrode pattern E1 or the third electrode pattern E3 in the manufacturing process, so that the variation of the feedthrough voltage can be reduced. Therefore, when Cst and Cgs are varied due to the process variation, the variation of the feedthrough voltage can be reduced by hollowing the electrode in this embodiment, and then the variation of the voltage drop for driving the LC molecules of the pixel Pa can be reduced.

Figure 6:
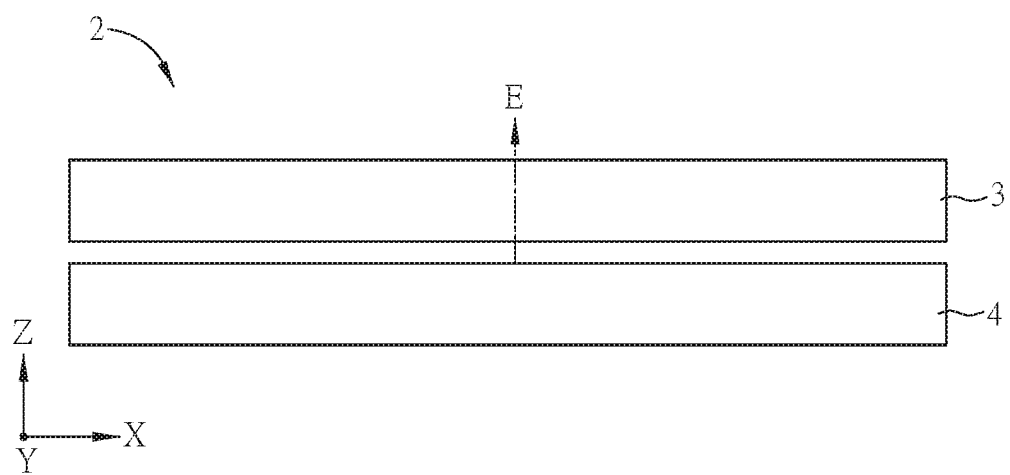
FIG. 6 is a schematic diagram of the display device of an embodiment of the disclosure.

Referring to FIG. 6, it is a schematic diagram of the display device 2 of an embodiment of the disclosure.

The display device 2 includes a display panel 3 and a backlight module 4 disposed opposite the display panel 3. The display device 2 is an LCD device, and the display panel 3 can be any of the above-mentioned display panels 1, 1a or a variation thereof, so the description thereof is omitted here. When the backlight module 4 emits the light E passing through the display panel 3, the pixels of the display panel 3 can display colors to form images accordingly.

Summarily, in the display panel and the display device of the disclosure, the first electrode pattern of the pixel includes a first connection portion and a first protrusion and the second electrode pattern of the pixel includes a second connection portion and two second protrusions. The second protrusions are respectively connected with two sides of the second connection portion and are extended towards the first connection portion. The first protrusion is connected with the first connection portion and is extended towards the second connection portion and to the location between the second protrusions. The first protrusion includes a first connection end which is connected with the first connection portion and a first distal end, and one of the second protrusions includes a second connection end which is connected with the second connection portion and a second distal end. Besides, the width of the first connection end is greater than that of the first distal end, and the width of the second connection end is greater than that of the second distal end. By the pixel layout design of this disclosure, when the first data voltage is transmitted to the first electrode pattern through the first data line and the second data voltage is transmitted to the second electrode pattern through the second data line, a voltage difference is formed between the first electrode pattern and the second electrode pattern to form the electric field driving the LC molecules of the pixel, so that the pixel can correspondingly display and the display panel can display an image. Accordingly, in comparison with the conventional art, because the voltage drop for driving the LC molecules is not formed by the pixel electrode and the common electrode, the Mura problem won't be caused even if the common voltage at the display area is not uniform. Therefore, the display quality of the display panel and the display device can be improved.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
a first substrate;
a second substrate disposed opposite the first substrate; and
at least one pixel configured between the first substrate and the second substrate, and comprising a first transistor, a second transistor, a first electrode pattern and a second electrode pattern which are disposed on the first substrate, wherein the at least one pixel further comprises a third electrode pattern overlapping the first electrode pattern or the second electrode pattern, the third electrode pattern is disposed around the first electrode pattern and the second electrode pattern, the first transistor comprises a first drain electrically connected with the first electrode pattern, the second transistor comprises a second drain electrically connected with the second electrode pattern, the first electrode pattern of the at least one pixel comprises a first connection portion and only one first protrusion, the second electrode pattern of the at least one pixel comprises a second connection portion and two second protrusions, the second protrusions are respectively directly connected with two sides of the second connection portion and are extended towards the first connection portion parallel to the first substrate, the second connection portion is extended from one of the second protrusions to the other one of the second protrusions so that the second connection portion and the second protrusions form a same uninterrupted layer, the first protrusion is connected with the first connection portion, the first protrusion is extended towards the second connection portion parallel to the first substrate and the first protrusion is between the second protrusions,
wherein the first protrusion comprises a first connection end which is connected with the first connection portion and a first distal end, one of the second protrusions comprises a second connection end which is connected with the second connection portion and a second distal end, a width of the first connection end is greater than that of the first distal end, and a width of the second connection end is greater than that of the second distal end.

2. The display panel as recited in claim 1, wherein an interval between the first protrusion and one of the second protrusions is between 8 μm and 30 μm.

3. The display panel as recited in claim 1, wherein the first transistor and the second transistor are disposed symmetrically.

4. The display panel as recited in claim 1, wherein the first drain is electrically connected with the first electrode pattern through a first via, and the second drain is electrically connected with the second electrode pattern through two second vias.

5. The display panel as recited in claim 4, wherein the second vias are disposed corresponding to the second protrusions.

6. The display panel as recited in claim 1, wherein the pixel further comprises a scan line, a first data line and a second data line, the first transistor further comprises a first gate and a first source, the second transistor further comprises a second gate and a second source, the scan line is connected with the first gate and the second gate, the first data line is connected with the first source, and the second data line is connected with the second source.

7. The display panel as recited in claim 1, wherein the pixel further comprises a first data line, the first data line is disposed beside the pixel, the third electrode pattern is disposed at the periphery of the pixel, and the third electrode pattern partially overlaps the first electrode pattern and the first data line.

8. The display panel as recited in claim 7, wherein the first connection portion of the first electrode pattern comprises a first opening, the third electrode pattern comprises a second opening, the first opening overlaps the third electrode pattern, and the second opening is adjacent to the first opening and partially overlaps the first connection portion.

9. The display panel as recited in claim 1, comprising: a plurality of pixels, wherein each of the pixels comprises two data lines respectively disposed at two sides of the pixel, and for the adjacent two pixels, voltage signals of the two data lines closer to each other have the same polarity.

10. The display panel as recited in claim 1, wherein an opening area on two sides of the extending direction of the first protrusion of the pixel has a symmetrical shape.

11. The display panel as recited in claim 1, wherein the first electrode pattern and the second electrode pattern are configured to form a voltage difference therebetween to generate an electric field to drive LC molecules.

12. The display panel as recited in claim 1, wherein the first protrusion is located at the center area of the pixel, wherein the second protrusions, the second connection portion and the first connection portion are near the periphery of the pixel, and the third electrode pattern is not a scan line or a data line.

13. The display panel as recited in claim 1, wherein the width of the first protrusion is gradually decreased from the first connection end to the first distal end.

14. A display device, comprising:
a backlight module; and
a display panel disposed opposite the backlight module and comprising a first substrate, a second substrate and at least one pixel, wherein the second substrate is disposed opposite the first substrate, the at least one pixel is configured between the first substrate and the second substrate and comprises a first transistor, a second transistor, a first electrode pattern and a second electrode pattern which are disposed on the first substrate, wherein the at least one pixel further comprises a third electrode pattern overlapping the first electrode pattern or the second electrode pattern, the third electrode pattern is disposed around the first electrode pattern and the second electrode pattern, the first transistor comprises a first drain electrically connected with the first electrode pattern, the second transistor comprises a second drain electrically connected with the second electrode pattern, the first electrode pattern of the at least one pixel comprises a first connection portion and only one first protrusion, the second electrode pattern of the at least one pixel comprises a second connection portion and two second protrusions, the second protrusions are respectively directly connected with two sides of the second connection portion and are extended towards the first connection portion parallel to the first substrate, the second connection portion is extended from one of the second protrusions to the other one of the second protrusions so that the second connection portion and the second protrusions form a same uninterrupted layer, the first protrusion is connected with the first connection portion, and the first protrusion is extended towards the second connection portion parallel to the first substrate and the first protrusion is between the second protrusions, wherein the first protrusion comprises a first connection end which is connected with the first connection portion and a first distal end, one of the second protrusions comprises a second connection end which is connected with the second connection portion and a second distal end, a width of the first connection end is greater than that of the first distal end, and a width of the second connection end is greater than that of the second distal end.

15. The display device as recited in claim 14, wherein an interval between the first protrusion and one of the second protrusions is between 8 μm and 30 μm.

16. The display device as recited in claim 14, wherein the first drain is electrically connected with the first electrode pattern through a first via, and the second drain is electrically connected with the second electrode pattern through two second vias.

17. The display device as recited in claim 16, wherein the second vias are disposed corresponding to the second protrusions.

18. The display device as recited in claim 14, wherein the pixel further comprises a scan line, a first data line and a second data line, the first transistor further comprises a first gate and a first source, the second transistor further comprises a second gate and a second source, the scan line is connected with the first gate and the second gate, the first data line is connected with the first source, and the second data line is connected with the second source.

19. The display device as recited in claim 14, wherein the pixel further comprises a first data line, the first data line is disposed beside the pixel, the third electrode pattern is disposed at the periphery of the pixel and partially disposed between the first electrode pattern and the first data line, and the third electrode pattern partially overlaps the first electrode pattern and the first data line.

20. The display device as recited in claim 19, wherein the first connection portion of the first electrode pattern comprises a first opening, the third electrode pattern comprises a second opening, the first opening overlaps the third electrode pattern, and the second opening is adjacent to the first opening and partially overlaps the first connection portion.

21. The display device as recited in claim 14, wherein an opening area on two sides of the extending direction of the first protrusion of the pixel has a symmetrical shape.

22. The display device as recited in claim 14, wherein the first electrode pattern and the second electrode pattern are configured to form a voltage difference therebetween to generate an electric field to drive LC molecules.

23. The display device as recited in claim 14, wherein the first protrusion is located at the center area of the pixel, wherein the second protrusions, the second connection portion and the first connection portion are near the periphery of the pixel, and the third electrode pattern is not a scan line or a data line.

24. The display device as recited in claim 14, wherein the width of the first protrusion is gradually decreased from the first connection end to the first distal end.

* * * * *